United States Patent
Pan et al.

(10) Patent No.: US 12,440,268 B2
(45) Date of Patent: Oct. 14, 2025

(54) SEMICONDUCTOR LIGHT SOURCE HAIR REMOVAL DEVICE WITH OPTIMIZED HEAT DISSIPATION

(71) Applicant: SHENZHEN LEAFLIFE TECH. CO., LTD., Guangdong (CN)

(72) Inventors: Shaohui Pan, Guangdong (CN); Jian Liu, Guangdong (CN)

(73) Assignee: Shenzhen LeafLife Tech. Co., Ltd., Shenzhen (CN)

( * ) Notice: Subject to any disclaimer, the term of this patent is extended or adjusted under 35 U.S.C. 154(b) by 454 days.

(21) Appl. No.: 17/918,036

(22) PCT Filed: Mar. 8, 2022

(86) PCT No.: PCT/CN2022/079797
§ 371 (c)(1),
(2) Date: Oct. 10, 2022

(87) PCT Pub. No.: WO2022/188787
PCT Pub. Date: Sep. 15, 2022

(65) Prior Publication Data
US 2023/0129185 A1 Apr. 27, 2023

(30) Foreign Application Priority Data
Mar. 8, 2021 (CN) .......................... 202120488512.2

(51) Int. Cl.
*A61B 18/20* (2006.01)
*A61B 18/00* (2006.01)

(52) U.S. Cl.
CPC .. *A61B 18/203* (2013.01); *A61B 2018/00017* (2013.01); *A61B 2018/00476* (2013.01);
(Continued)

(58) Field of Classification Search
CPC ........ A61B 18/20; A61B 18/203; A61N 5/06; A61N 5/0616; A61N 5/0617
See application file for complete search history.

(56) References Cited

U.S. PATENT DOCUMENTS

| | | | |
|---|---|---|---|
| 2003/0032950 A1* | 2/2003 | Altshuler | A45D 44/005 606/9 |
| 2007/0157627 A1* | 7/2007 | Hsu | F25B 21/02 62/3.2 |
| 2022/0346871 A1* | 11/2022 | Duan | A61B 18/18 |

FOREIGN PATENT DOCUMENTS

| | | |
|---|---|---|
| CN | 207804371 U | 9/2018 |
| CN | 110755153 A | 2/2020 |

(Continued)

OTHER PUBLICATIONS

International Search Report and Written Opinion for Corresponding PCT Application No. PCT/CN2022/079797.

*Primary Examiner* — Lynsey C Eiseman

(57) ABSTRACT

Disclosed is a semiconductor light source hair removal device with optimized heat dissipation, comprising a housing (1), a hair removal assembly (2) fixed to the housing (1), a fan (4), a circuit board (5), and a control power board (6). The housing (1) is provided with an accommodating cavity for accommodating the fan (4), the circuit board (5) and the control power board (6). The hair removal assembly (2), the fan (4) and the control power board (6) are electrically connected to the circuit board (5). The housing (1) is provided with at least one heat dissipation port. The hair removal assembly (2) comprises a treatment head (20), a thermoelectric cooler (24), a light source chip (25) and a heat dissipation component (26). The heat dissipation component (26) comprises heat sink fins (261) and at least one heat pipe.

18 Claims, 3 Drawing Sheets

(52) U.S. Cl.
CPC ............... *A61B 2018/00922* (2013.01); *A61B 2018/202* (2013.01)

(56) References Cited

FOREIGN PATENT DOCUMENTS

| | | | | |
|---|---|---|---|---|
| CN | 211381746 U | 9/2020 | | |
| CN | 211433284 U | 9/2020 | | |
| CN | 211633558 U | 10/2020 | | |
| CN | 215018854 U | 12/2021 | | |
| WO | WO-2015120118 A1 * | 8/2015 | ............ | H01S 5/005 |
| WO | WO-2021027261 A1 * | 2/2021 | ............ | A61B 18/18 |

* cited by examiner

SEMICONDUCTOR LIGHT SOURCE HAIR REMOVAL DEVICE WITH OPTIMIZED HEAT DISSIPATION

CROSS-REFERENCE TO RELATED APPLICATION

This patent application claims the benefit and priority of Chinese Patent Application No. 202120488512.2, filed with the China National Intellectual Property Administration on Mar. 8, 2021, the disclosure of which is incorporated by reference herein in its entirety as part of the present application.

TECHNICAL FIELD

The present disclosure relates to the technical field of hair removal devices, and in particular relates to a semiconductor light source hair removal device with optimized heat dissipation.

BACKGROUND

Hair removal device is also called hair removal machine, referring to a small electric appliance used for body hair removal. The hair removal devices on the market are mainly "female hair removal devices" used for removing armpit hair, leg hair and the hair at other parts of the body, which contributes to the beauty of women's dress.

However, existing hair removal devices have the following defects: during the use of the hair removal device, the internal temperature of the device body continues to rise, while the whole body is relatively enclosed and not conducive to heat dissipation, it is easy to cause the burnout of the hair removal device or burn the user.

SUMMARY

The technical problem mainly solved by the present disclosure is to provide a semiconductor light source hair removal device with optimized heat dissipation, which employs a novel heat dissipation design to effectively improve the heat dissipation function of the hair removal device.

An embodiment of the present disclosure provides a semiconductor light source hair removal device with optimized heat dissipation. The semiconductor light source hair removal device comprises a housing, a hair removal assembly fixed to the housing, a fan, a circuit board, and a control power board. The housing is provided with an accommodating cavity for accommodating the fan, the circuit board and the control power board. The hair removal assembly, the fan and the control power board are electrically connected to the circuit board. The housing is provided with at least one heat dissipation port. The hair removal assembly comprises a treatment head, a thermoelectric cooler, a light source chip and a heat dissipation component. The heat dissipation component comprises heat sink fins and at least one heat pipe; and the thermoelectric cooler and/or the light source chip are/is connected, by the heat pipe, to the heat sink fins.

In some embodiments, the at least one heat dissipation port may comprise a first heat dissipation port and a second heat dissipation port. The first heat dissipation port and the second heat dissipation port are respectively located on two opposite sidewalls of the housing.

In some embodiments, the housing may comprise an upper housing and a lower housing connected to each other. The first heat dissipation port is provided on the upper housing, and the second heat dissipation port is provided on the lower housing.

In some embodiments, the lower part of the lower housing may be provided with a handle on which a key may be provided.

In some embodiments, the handle may be hollow, and the control power board may be installed in the handle.

In some embodiments, the control power board may be connected to the handle by a screw. The key may be used for controlling the hair removal assembly and the fan to operate.

In some embodiments, the at least one heat pipe comprises a first heat pipe and a second heat pipe. The first heat pipe and the second heat pipe may both be in heat conduction connection with the heat sink fins.

In some embodiments, the first heat pipe may be U-shaped, and two free sections of the first heat pipe may be arranged in the heat sink fins in a penetrating manner.

In some embodiments, the second heat pipe may be step-shaped, and may comprise an intermediate section and a first section and a second section which are connected to both sides of the intermediate section, respectively. The first section and the second section may extend from both ends of the intermediate section to the opposite directions, respectively.

In some embodiments, the first section of the second heat pipe may be located between the two free sections of the first heat pipe.

In some embodiments, the light source chip may be arranged at the end section of the first heat pipe and the intermediate section of the second heat pipe.

In some embodiments, the hair removal device further comprises a sealing seat, and a heat insulation sheet arranged between the treatment head and the sealing seat.

In some embodiments, the hair removal device further comprises a fixing part. The first part is arranged above the fan, and the heat dissipation component is arranged above the fixing part.

In some embodiments, an air outlet of the fan is towards the folded heat sink fins.

In some embodiments, the light source chip employs an ultrathin beryllium oxide ceramic submount and is assisted with an artificial diamond film coating; and the ceramic submount is brazed with the at least one heat pipe.

In some embodiments, the treatment head, the heat insulation sheet, the sealing seat may be connected by screws so as to be isolated from external dust, and the light source chip and a light outlet of the treatment head are concentric.

In some embodiments, the first heat pipe, the second heat pipe and the heat sink fins may be directly riveted and brazed. The heat sink fins may be folded heat sink fins.

In some embodiments, the hair removal device may further comprise an insulating pressing plate. The cold side of the thermoelectric cooler is pressed, by the insulating pressing plate, on the treatment head, the hot side of the thermoelectric cooler is tightly attached to the second heat pipe, and the heat of the thermoelectric cooler is conducted, by the second heat pipe, to the heat sink fins.

In some embodiments, the fan may be an axial flow fan.

In some embodiments, the control power board may be of a multi-phase interleaved parallel design.

The embodiments of the present disclosure have the beneficial effects that this design employs a novel heat dissipation design, which greatly improves the heat dissipation function of the hair removal device and avoids the heat transfer to the chip from the wire heating, and thus the heat load of the chip is reduced, the requirement for low temperature of the light source chip is satisfied, and the optimal cooling effect is achieved.

BRIEF DESCRIPTION OF THE DRAWINGS

To describe the technical solutions in the embodiments of the present disclosure or in the prior art more clearly, the following briefly introduces the accompanying drawings required for describing the embodiments. Apparently, the accompanying drawings in the following description show merely some embodiments of the present disclosure, and a person of ordinary skill in the art may still derive other drawings from these accompanying drawings without creative efforts.

DETAILED DESCRIPTION OF THE EMBODIMENTS

The implementation of the objectives, functional characteristics and advantages of the present disclosure will be further described below in conjunction with embodiments and with reference to the accompanying drawings.

Figure 1:
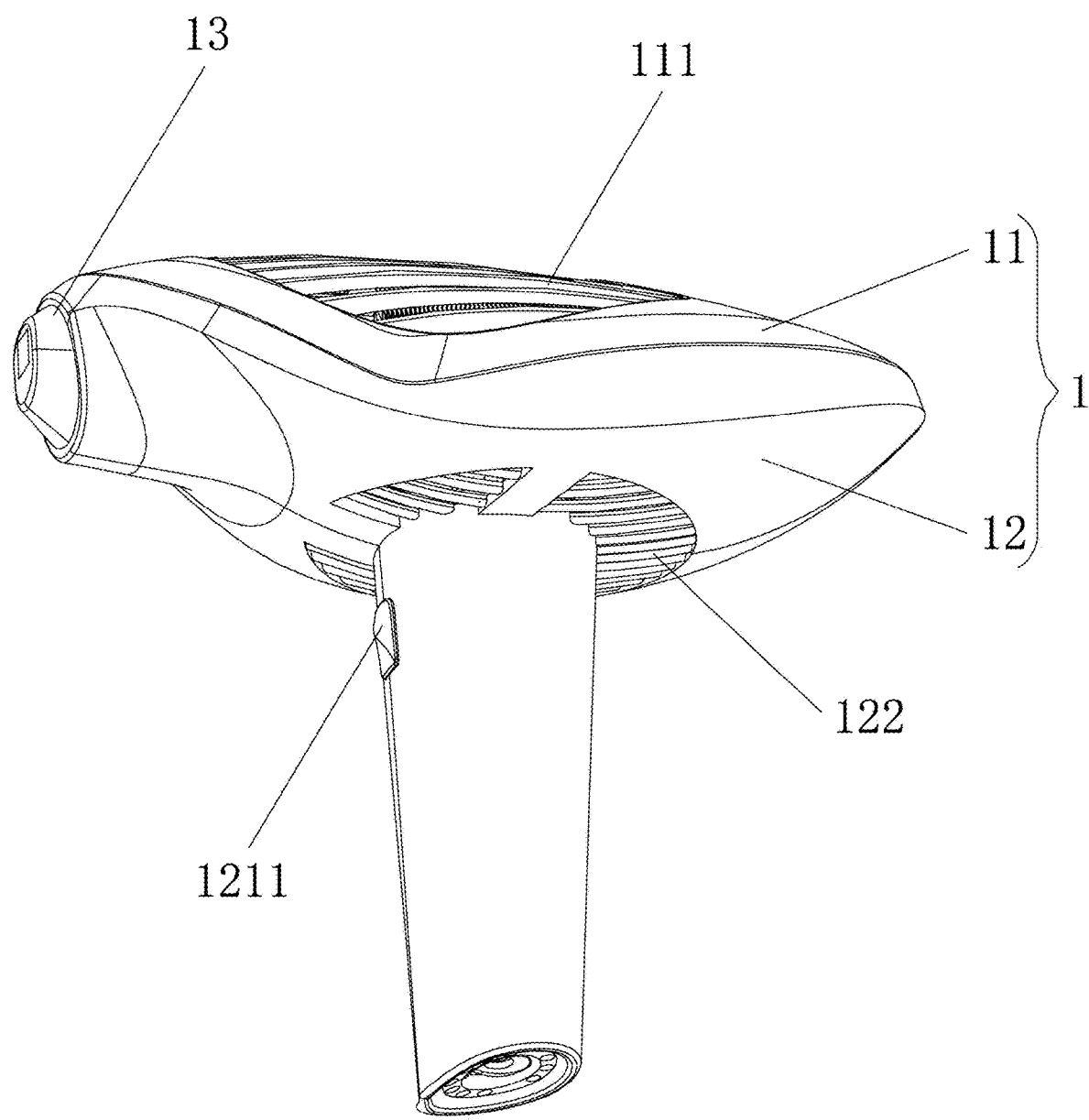
FIG. 1 is an exploded view of a semiconductor light source hair removal device with optimized heat dissipation in accordance with an embodiment of the present disclosure.
Figure 2:
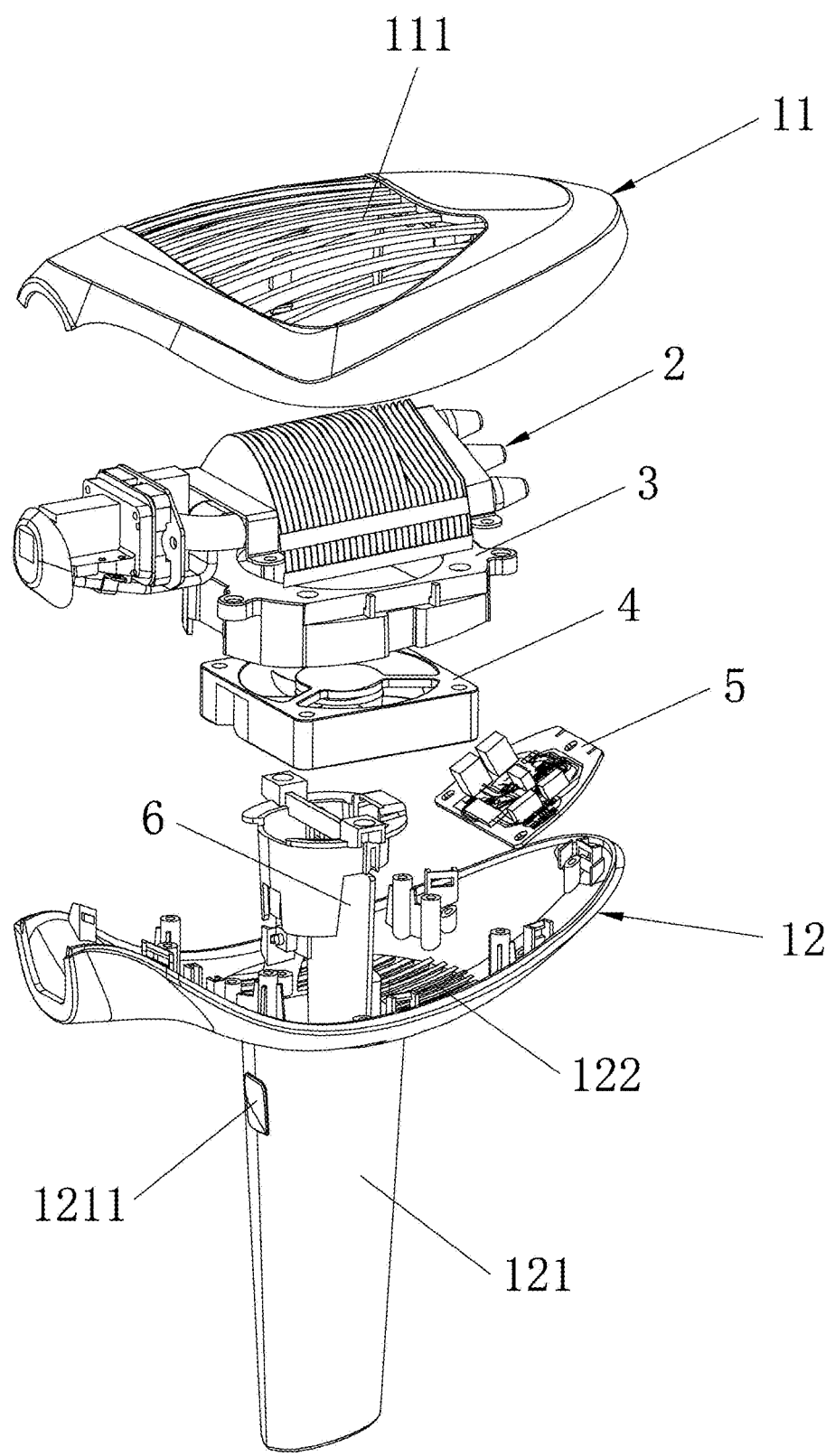
FIG. 2 is an exploded view of a hair removal assembly of a semiconductor light source hair removal device with optimized heat dissipation in accordance with an embodiment of the present disclosure.
Figure 3:
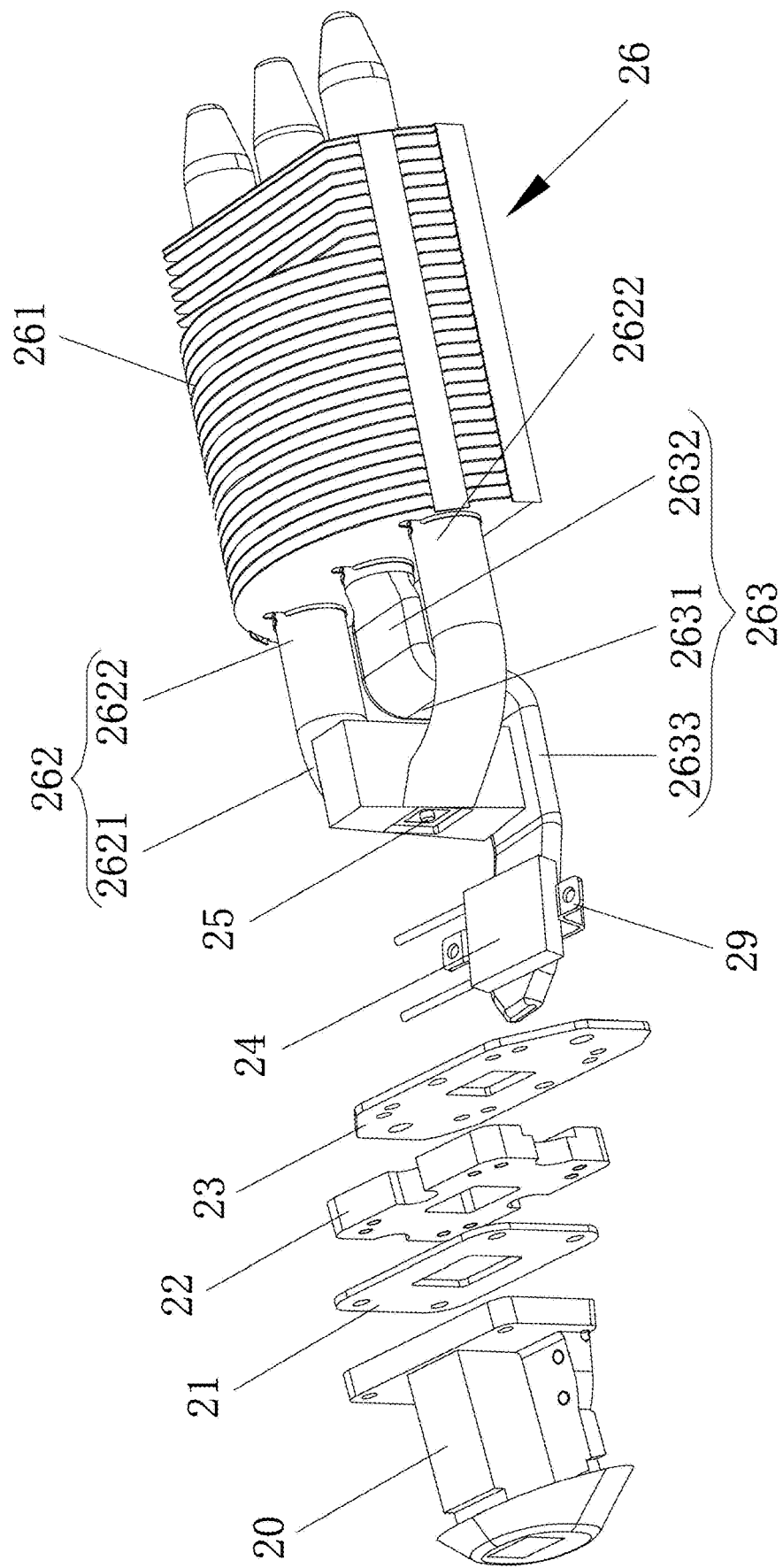
FIG. 3 is a three-dimensional view of a semiconductor light source hair removal device with optimized heat dissipation in accordance with an embodiment of the present disclosure.

As shown in FIG. 1 to FIG. 3, a semiconductor light source hair removal device with optimized heat dissipation provided by an embodiment of the present disclosure comprises a housing 1, a hair removal assembly 2 arranged in the housing 1, a fan 4, a circuit board 5, and a control power board 6. The housing 1 is internally provided with an accommodating cavity. The hair removal assembly 2, the fan 4 and the control power board 6 are arranged in the accommodating cavity. The hair removal assembly 2, the fan 4 and the control power board 6 are electrically connected to the circuit board 5. In this embodiment, the fan 4 is an axial flow fan. It may be understood that in other embodiments, the fan may also be a centrifugal fan. The circuit board 5 is preferably a PCB (printed circuit board).

The hair removal assembly 2 comprises a treatment head 20, a sealing seat 22, a chip board 23, a thermoelectric cooler 24, a light source chip 25 and a heat dissipation component 26. Specifically, as shown in FIG. 1 and FIG. 2, the housing 1 is provided with an opening 13 penetrating through the sidewall thereof, and the treatment head 20 extends out via the opening 13. The sealing seat 22 is arranged at the opening 13 and is used for sealing the accommodating cavity. The cold side of the thermoelectric cooler 24 is connected to the treatment head 20, the hot side of the thermoelectric cooler is connected to the heat dissipation component 26, and the heat generated by the thermoelectric cooler 24 is conducted to the heat dissipation component 26, and then is dissipated by means of the heat dissipation component 26. Preferably, an insulating pressing plate 29 is arranged below the thermoelectric cooler 24, and the cold side and the hot side of the thermoelectric cooler 24 are respectively pressed at the treatment head 20 and the heat dissipation component 26. In this embodiment, the heat dissipation component 26 comprises at least one heat pipe and heat sink fins 261. Two parts of the heat pipe are respectively connected to the thermoelectric cooler 24 and the heat sink fins 261, and used for transferring the heat on the thermoelectric cooler 24 to the heat sink fins 261 rapidly for heat dissipation.

The housing 1 comprises an upper housing 11 and a lower housing 12. The upper housing 11 and the lower housing 12 are connected in an up-and-down encircling manner. Preferably, the upper housing 11 is provided with a first heat dissipation port 111, and the lower surface of the lower housing 12 is provided with a second heat dissipation port 122. Air flow is generated when the fan operates, the first heat dissipation port 111 and the second heat dissipation port 122 are provided to facilitate the air in the accommodating cavity to form convection with the external air, thus dissipating the heat in the accommodating cavity to the external. In this embodiment, the heat in the accommodating cavity can be rapidly and efficiently dissipated in cooperation with the air flow generated when the fan operates. Preferably, the first heat dissipation port 111 and the second heat dissipation port 122 are both formed by a plurality of grooves spaced from one another. In this embodiment, a handle 121 is further connected to the middle of the bottom end of the lower housing 12. Preferably, the handle 121 extends downwards and gradually narrows to form a streamlined shape. In this embodiment, the handle 121 is hollow, the upper housing 11, the lower housing 12 and the handle 121 are enclosed to form an approximately T-shaped accommodating cavity, that is, the accommodating cavity comprises a first accommodating cavity and a second accommodating cavity communicating with each other. The first accommodating cavity is formed by encircling the upper housing 11 and the lower housing 12, and the second accommodating cavity is defined by the handle 121. Preferably, the hair removal assembly 2, the fan 4, and the circuit board 5 are installed in the first accommodating cavity. The control power board 6 is installed in the second accommodating cavity. The handle 121 is externally provided with a key 1211. Preferably, the second heat dissipation port 122 is arranged around the handle 121.

Preferably, the hair removal device of this embodiment further comprises a heat insulation sheet 21 provided between the treatment head 20 and the sealing seat 22. The treatment head 20 and the sealing seat 22 are isolated by the heat insulation sheet 21, thereby preventing the heat of the sealing seat 22 from being directly conducted to the treatment head 20.

Preferably, the hair removal device of this embodiment further comprises a fixing part 3, and the hair removal assembly 2 is installed on the fixing part 3. Specifically, the fixing part 3 is arranged between the fan and the heat sink fins 261 and used for fixing the heat sink fins 261. Preferably, an air outlet of the fan 4 is towards the heat sink fins 261. Preferably, the heat sink fins 261 substantially face the first heat dissipation port 111.

As shown in FIG. 3, in this embodiment, the heat pipe comprises a first heat pipe 262 and a second heat pipe 263. The heat sink fins 261 are preferably folded heat sink fins. The heat sink fins 261 are in a shape of rectangular cuboid as a whole.

The first heat pipe 262 is U-shaped, with an end section 2621 and two free sections 2622 arranged at the lower surface of the heat sink fins 261 in a penetrating manner.

The second heat pipe 263 is step-shaped, including an intermediate section 2631, and a first section 2632 and a second section 2633 extending from two opposite ends of the intermediate section 2631 in directions away from each other. The first section 2632 is also arranged in the heat sink fins 261 in a penetrating manner and is approximately in the same plane as the first heat pipe 262. Preferably, the first section 2632 is located between two free sections 2622 of the first heat pipe 262.

The intermediate section 2631 of the second heat pipe 263 is perpendicular to the first section 2632 and the second section 2633, respectively, and the intermediate section 2631 approximately corresponds to the end section 2621 of the first heat pipe 262. The second section 2633 is tightly attached to the hot side of the thermoelectric cooler 24. Preferably, the light source chip 25 is arranged at the end section 2621 of the first heat pipe 262 and the intermediate section 2631 of the second heat pipe 263. By means of the combined action of the two heat pipes, the heat generated by the light source chip 25 can be effectively conducted to the heat pipes for heat dissipation.

Preferably, the light source chip 25 and the chip board 23 are welded by a gold wire. The light source chip 25 employs an ultrathin beryllium oxide ceramic submount and is assisted with an artificial diamond film coating. The ceramic submount is brazed with the first heat pipe 26. The light source chip 25 is used for emitting laser for hair removal.

Preferably, the treatment head 20, the heat insulation sheet 21 and the sealing seat 22 are connected by means of screws so as to be isolated from external dust. The concentricity of the light source chip 25 and a light outlet of the treatment head 20 is ensured.

As shown in FIG. 1 and FIG. 2, the first heat pipe 26, the second heat pipe 28 and the heat sink fins 261 are directly riveted and brazed. The heat sink fins 261 are used for enabling the light source chip 25 and the thermoelectric cooler 24 to dissipate heat, which are preferably folded heat sink fins. In this embodiment, the heat sink fins are non-equal-thickness folded heat sink fins.

As shown in FIG. 1 and FIG. 2, the cold side of the thermoelectric cooler 24 is pressed, by the insulating pressing plate 29, on the treatment head 20, the hot side of the thermoelectric cooler 24 is tightly attached to the second heat pipe 28 for heat dissipation.

In some embodiments, as shown in FIG. 1 to FIG. 3, the control power board 6 is connected to the handle 121 by a screw. The key 1211 is used for controlling the hair removal assembly 2 and the fan to operate, namely, performing laser hair removal.

As shown in FIG. 1 and FIG. 2, the control power board 6 is of a multi-phase interleaved parallel design.

During the operation of the treatment instrument of this embodiment, the energy is set to an appropriate gear, the treatment head 20 is clung to the part needing to be treated, and then the light-emitting treatment can be carried out by pressing the key 1211. During the light-emitting treatment, the heat generated by the light source chip 25 and the thermoelectric cooler 24 can be effectively dissipated by means of the first heat pipe 26, the second heat pipe 28 and the heat sink fins 261. An effective guarantee is provided for the continuous and efficient operation of the light source chip 25, such that the requirement for low temperature of the light source chip 25 is satisfied, and the requirement for heat dissipation optimization is satisfied.

Finally, it should be noted that the above embodiments are only used to illustrate the technical solutions of the present disclosure rather than limiting the same. Although the present disclosure has been described in detail with reference to the foregoing embodiments, it should be understood by those of ordinary skill in the art that it is still possible to modify the technical solutions recorded in the foregoing embodiments, or to equivalently replace some or all of technical features; and that these modifications or replacements do not make the essence of the corresponding technical solutions deviate from the scope of the technical solutions of the embodiments of the present disclosure.

To make objectives, technical solutions, and advantages of the present disclosure clearer, the technical solutions in the present disclosure are described clearly and completely in the following with reference to accompanying drawings in the embodiments of the present disclosure. Apparently, the described embodiments are only part rather than all of the embodiments of the present disclosure. On the basis of the embodiments of the present disclosure, all other embodiments acquired by those of ordinary skill in the art without making inventive efforts fall within the scope of protection of the present disclosure.

The invention claimed is:

1. A semiconductor light source hair removal device with optimized heat dissipation, comprising a housing, a hair removal assembly fixed to the housing, a fan, a circuit board, and a control power board, wherein
    the housing is provided with an accommodating cavity for accommodating the fan, the circuit board and the control power board, and at least one heat dissipation port is defined in the housing;
    the hair removal assembly, the fan and the control power board are electrically connected to the circuit board;
    the hair removal assembly comprises a treatment head, a thermoelectric cooler, a light source chip and a heat dissipation component;
    the thermoelectric cooler comprises a cold side and a hot side, the cold side is attached to the treatment head;
    the heat dissipation component comprises heat sink fins and at least one heat pipe connected to the heat sink fins; and
    the hot side of the thermoelectric cooler and the light source chip both are attached to the at least one heat pipe, so that heat generated by the light source chip and the thermoelectric cooler is transferred to the heat sink fins for dissipation through the at least one heat pipe during use.

2. The semiconductor light source hair removal device with optimized heat dissipation according to claim 1, wherein the at least one heat dissipation port comprises a first heat dissipation port and a second heat dissipation port; the first heat dissipation port and the second heat dissipation port are respectively located on two opposite sidewalls of the housing.

3. The semiconductor light source hair removal device with optimized heat dissipation according to claim 2, wherein the housing comprises an upper housing and a lower housing connected to each other; the first heat dissipation port is provided on the upper housing and faces the heat sink fins, and the second heat dissipation port is provided on the lower housing.

4. The semiconductor light source hair removal device with optimized heat dissipation according to claim 3, wherein the lower part of the lower housing is provided with a handle, and the second heat dissipation port is arranged around the handle.

5. The semiconductor light source hair removal device with optimized heat dissipation according to claim 4, wherein the handle is hollow, a key is provided on the handle, and the control power board is installed in the handle.

6. The semiconductor light source hair removal device with optimized heat dissipation according to claim 5, wherein the control power board is connected to the handle, and the key is used for controlling the hair removal assembly and the fan to operate.

7. The semiconductor light source hair removal device with optimized heat dissipation according to claim 1, further comprising a sealing seat and a heat insulation sheet arranged between the treatment head and the sealing seat.

8. The semiconductor light source hair removal device with optimized heat dissipation according to claim 7, wherein the light source chip and a light outlet of the treatment head are concentric.

9. The semiconductor light source hair removal device with optimized heat dissipation according to claim 1, further comprising a fixing part, wherein the fixing part is arranged above the fan, and the heat dissipation component is arranged above the fixing part.

10. The semiconductor light source hair removal device with optimized heat dissipation according to claim 1, wherein the fan is configured with an air outlet facing towards the heat sink fins, so that airflow generated by the fan flows through the heat sink fins to dissipate the heat generated by the light source chip and the thermoelectric cooler and transferred to the heat sink fins through the at least one heat pipe.

11. The semiconductor light source hair removal device with optimized heat dissipation according to claim 1, wherein the light source chip is brazed with the at least one heat pipe.

12. The semiconductor light source hair removal device with optimized heat dissipation according to claim 1, wherein the fan is an axial flow fan.

13. The semiconductor light source hair removal device with optimized heat dissipation according to claim 1, wherein the at least one heat pipe comprises a first heat pipe being U-shaped and comprising a middle section and two free sections respectively extending from two opposite ends of the middle section in a same direction, the light source chip is attached to the middle section, and the two free sections extend through the heat sink fins.

14. The semiconductor light source hair removal device with optimized heat dissipation according to claim 13, wherein the at least one heat pipe further comprises a second heat pipe, and the hot side of the thermoelectric cooler and the light source chip both are attached to the second heat pipe.

15. The semiconductor light source hair removal device with optimized heat dissipation according to claim 14, wherein the first heat pipe, the second heat pipe and the heat sink fins are directly riveted and brazed, and the heat sink fins are folded heat sink fins.

16. The semiconductor light source hair removal device with optimized heat dissipation according to claim 14, wherein the second heat pipe comprises an intermediate section and a first section and a second section which extend from two opposite ends of the intermediate section in two opposite directions, respectively; the hot side of the thermoelectric cooler is attached to the intermediate section of the second heat pipe, and the light source chip is attached to the second section of the second heat pipe, and the first section of the second heat pipe extends through the heat sink fins.

17. The semiconductor light source hair removal device with optimized heat dissipation according to claim 16, wherein the first section of the second heat pipe is located between the two free sections of the first heat pipe.

18. The semiconductor light source hair removal device with optimized heat dissipation according to claim 17, wherein the intermediate section of the second heat pipe is perpendicular to the first section and the second section, and the second heat pipe in whole is step-shaped.

* * * * *